United States Patent [19]

Eisenberger

[11] 4,028,547

[45] June 7, 1977

[54] X-RAY PHOTOLITHOGRAPHY

[75] Inventor: Peter Michael Eisenberger, Morristown, N.J.

[73] Assignee: Bell Telephone Laboratories, Incorporated, Murray Hill, N.J.

[22] Filed: June 30, 1975

[21] Appl. No.: 591,695

[52] U.S. Cl. .............................. 250/272; 250/276; 250/280; 250/492 A
[51] Int. Cl.² ........................................ H01J 37/00
[58] Field of Search ............ 250/492 R, 492 A, 280, 250/272, 276, 273

[56] References Cited

UNITED STATES PATENTS

| 3,424,428 | 1/1969 | Canon | 250/280 |
|---|---|---|---|
| 3,612,861 | 10/1971 | Dorfler | 250/280 |
| 3,743,842 | 7/1973 | Smith | 250/492 A |

OTHER PUBLICATIONS

"Ultrafine Line Projection System," Feder et al., IBM Tech. Bulletin, vol. 16, No. 9, Feb. 1974, pp. 3121–3122.

*Primary Examiner*—Craig E. Church
*Attorney, Agent, or Firm*—Allen N. Friedman

[57] ABSTRACT

Photolithography of microcircuits with elements in the micrometer size range is performed with X-ray exposure of photoresist layers through electron beam generated shadow masks. Synchrotron radiation from a particle accelerator is used as an intense source of well collimated X-rays and Bragg reflection from a mosaic crystal is used to provide spectral purity for good contrast in the exposed photoresist pattern.

3 Claims, 4 Drawing Figures

U.S. Patent   June 7, 1977   4,028,547
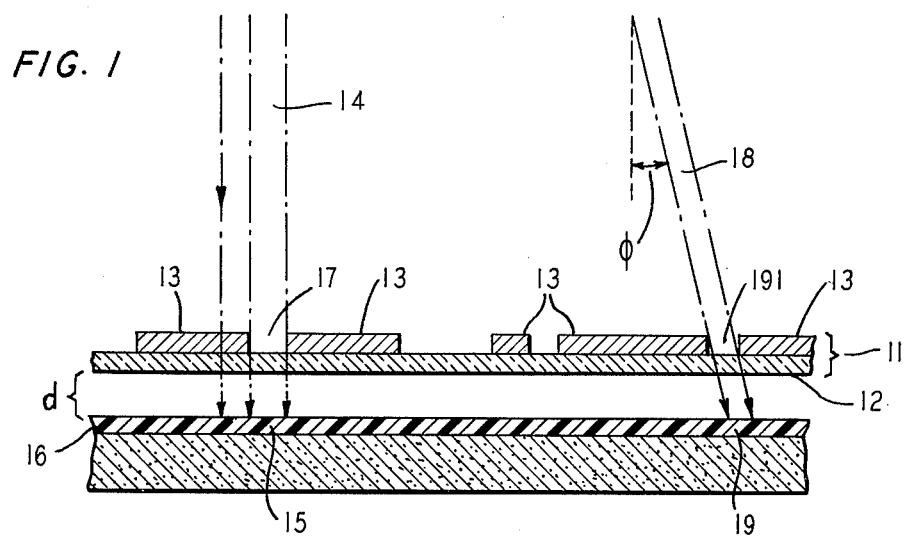
FIG. 1
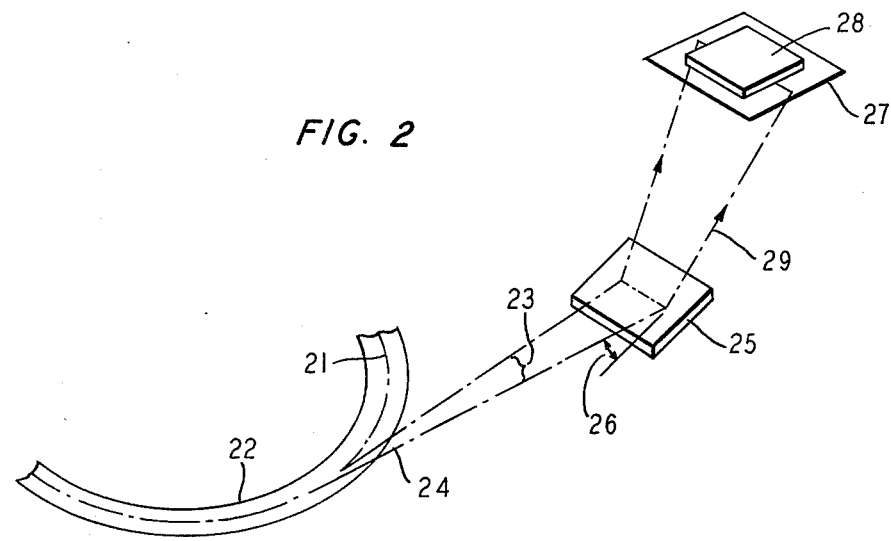
FIG. 2
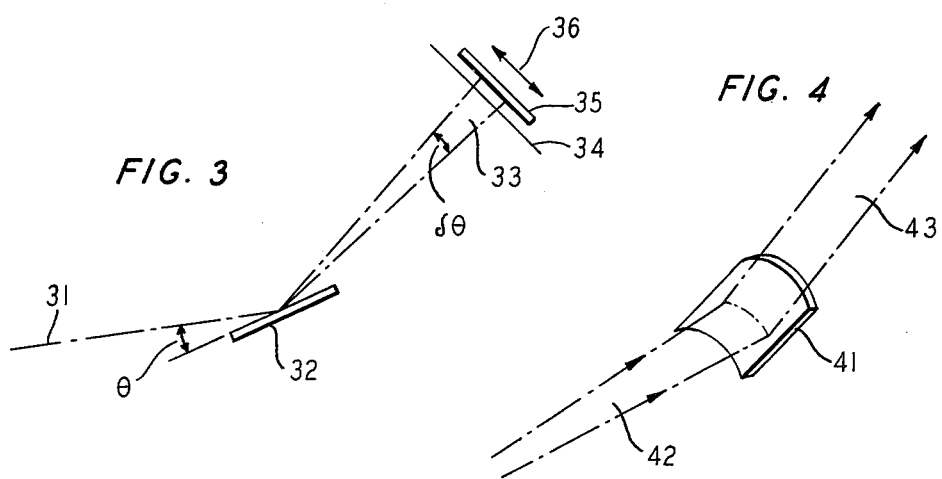
FIG. 3
FIG. 4

X-RAY PHOTOLITHOGRAPHY

BACKGROUND OF THE INVENTION

1. Field of the Invention

The invention is in the field of photolithographic processing of solid state devices.

2. Brief Description of the Prior Art

As the demand for higher package densities in solid state microcircuits has increased, the use of X-rays has been investigated as a means of reducing the diffraction limitation inherent in photolithographic processing in the visible and near visible spectral region (D. L. Spears et al, *Solid State Technology*, 5 (1972) 21–26). The exposure of photolithographic resist materials at the necessarily small scale has been accomplished by electron beam scanning. This method is satisfactory for the production of shadow masks, however, it is generally too slow for most production uses. X-rays in the 1 A to 100 A spectral region have sufficiently short wavelengths to overcome diffraction limitations in the production of microcircuits requiring element sizes in the micrometer to submicrometer range. The investigation of X-ray lithographic processes has included consideration of X-ray sources possessing sufficient intensity for the exposure of the photolithographic resist materials within reasonable production times. Another consideration is the provision of shadow mask materials and absorber layer thicknesses producing sufficient contrast in the exposed resist to permit further device processing. The collimation of the X-ray beam must also be considered since it affects the accurate reproduction of the pattern contained in the shadow mask.

The most common sources of X-ray radiation are vacuum tubes within which a beam of electrons, accelerated to the order of 20,000 volts is directed at a metal target. The emitted X-ray radiation contains one or more intense narrow lines, known as the characteristic radiation of the target, and a broad continuous background. The most thoroughly investigated X-ray lithographic process utilize the characteristic radiation. The selection of photomask absorber material and X-ray target material is governed by the requirement that the photomask material be highly absorptive at the wavelength of characteristic radiation of the X-ray target material. It has been found, however, that although the background radiation is much lower in intensity per unit bandwidth than the characteristic radiation, it extends over regions of the spectrum in which the shadow mask absorber layers are not as highly absorptive. Thus exposure of the resist material by background radiation tends to reduce the contrast of the exposed pattern. This requires, for example, the use of thicker layers of absorptive material than would be required if the characteristic radiation alone were present. The use of the thinnest possible absorber layers is desirable for producing patterns for higher and higher resolution.

Standard X-ray sources emit their radiation over a large solid angle. In using this radiation a balance must be reached between the desire to use as much of the emitted radiation as possible, in order to minimize exposure times, and the desire to limit the variation of incidence angle across the exposed sample. This angular limitation is accomplished by collimation of the beam and placement of the device to be exposed further from the X-ray source. This however is at the expense of reduced intensity and longer exposure time.

Synchrotron radiation from a particle accelerator is a known intense source of X-ray radiation. However the emission is over a broad continuous spectrum, which raises the questions of the reduced contrast treated above. Various filtering schemes utilizing selective absorption of unwanted portions of the X-ray spectrum have been considered. However such schemes are limited in their ability to provide high selectivity together with low absorption of the desired radiation.

SUMMARY OF THE INVENTION

A fast, high resolution X-ray photolithographic technique has been invented incorporating synchrotron radiation from a particle accelerator as a high intensity X-ray source and Bragg reflection from a mosaic crystal to provide spectral limitation without inordinately high loss of beam intensity. High resolution shadow masks, in the micrometer to submicrometer element size range can be generated by the inherently, relatively slow electron beam scanning techniques. However replication of these patterns for microcircuit production cannot be done by radiation in the visible region because of diffraction effects. Exposure of resist materials through these shadow masks requires an intense source of spectrally limited X-ray radiation to provide short resist exposure times and sufficient contrast with minimum shadow mask absorber thickness. Synchrotron radiation from a particle accelerator (e.g. an electron synchrotron or storage ring) provides an intense source of X-rays which are highly collimated in the plane of the particle orbit. This high degree of collimation permits the use of Bragg reflection from a crystal to provide spectral selectivity. The use of a mosaic crystal consisting of many crystallites possessing a random distribution of orientations with an angular spread of the order of $10^{-4}$ to $10^{-1}$ radians. In the 5A X-ray region, such mosaic crystals can be selected to provide bandwidth limitation of the order of 0.1A. Such mosaic crystals provide sufficient intensity in the reflected beam for short exposure time while providing sufficient spectral limitation to provide high contrast with relatively thin shadow mask absorber layers.

BRIEF DESCRIPTION OF THE DRAWINGS

FIG. 1 is an elevational view in section of a device precursor being exposed by X-rays incident through a shadow mask;

FIG. 2 is a perspective view of an exemplary system for operation of the inventive method;

FIG. 3 is an elevational view in section showing an X-ray beam being reflected from a mosaic crystal and incident on a device precursor; and FIG. 4 is a perspective view of a divergent X-ray beam being reflected from a mosaic crystal, which has been shaped to reduce the divergence of the beam.

DETAILED DESCRIPTION OF THE INVENTION

X-RAY LITHOGRAPHY

Photolithography processes using the X-ray region of the electromagnetic spectrum are being developed to overcome the size limitations in microcircuit production produced by diffraction in the visible or near visible spectral region. Microcircuits and microelectronic devices with minimum element size down to approximately 5 micrometers are produced by shining electromagnetic radiation in the visible region ($\lambda = 10^3$ to $10^4$ A) through shadow masks. The effect of the diffraction of electromagnetic radiation prevents the use of this technology for the replication of elements in the micrometer to submicrometer size range. This size range is being explored for solid state microcircuit and microelectronic device use. The shadow masks required for these devices can be generated by electron beam scanning techniques. However such techniques are too slow for much contemplated mass production of devices.

The herein disclosed invention relates to the use of X-rays in the 1A to 100A spectral range to overcome the above mentioned diffraction limitation. Such an X-ray lithographic technology requires an intense well collimated X-ray source and a shadow mask materials system which will produce a replicated pattern of good contrast in the exposed image forming layer. In current technology image forming layers are polymeric in nature and called photoresists. The basic principal of operation being that the irradiated portion of the layer sustains some change in the cohesive properties of the material (e.g. becomes more soluble or less soluble in a solvent). The shadow mask 11 (see FIG. 1) consists of a substrate 12 which is relatively transparent to X-rays in the spectral region employed and a patterned layer 13 of absorber material which is relatively more highly absorptive of the X-ray radiation. Substrate materials such as light oxide glasses (e.g., $SiO_2$) and polymeric films have been employed. Heavy metals such as gold, have been used as absorber materials. The X-ray absorption of metals varies rapidly with wavelength in the X-ray region. Thus a gold layer which is thick enough to produce sufficient contrast at one wavelength is too thin or unnecessarily thick at another. It is desirable to use as thin an absorber layer as possible, for economy and in order to achieve optimum quality of the exposed image. The usual approach to this problem is the selection of an X-ray tube target material whose characteristic radiation falls near a peak in the absorption spectrum of the absorber material used. However the background radiation, although much lower in intensity extends through low absorption wavelength regions producing poorer contrasts than would be available through the use of a more band limited source.

Another factor which must be considered in the use of X-ray tubes as sources is the fact that X-rays are emitted from these sources approximately uniformly over a large solid angle from approximately a point source. Thus the intensity falls as approximately the reciprocal of the square of the distance from the source. This fact makes operation close to the source desirable for minimizing exposure time. However there is a competing consideration operation to close to the source results in an unacceptably large variation in the angle of incidence of the X-rays across the device being exposed. This angular variation can produce a distortion in the exposed pattern sometimes called runout. This can be seen in FIG. 1 in which vertically incident X-ray beam 14 exposes a region 15 of the photoresist layer 16 directly below an aperture 17 in the absorber layer 13. However X-ray beam 18 incident at angle $\phi$ exposed an area 19 which is displaced from the corresponding aperture 191 in the absorber layer 13.

SYNCHROTRON RADIATION

Charged particles such as electrons or protons, travelling in a circular orbit in a particle accelerator emit electromagnetic radiation in a forward direction tangential to the path. This radiation is highly collimated in the plane of the orbit. The radiation is emitted in a broad spectrum whose maximum frequency and the frequency of peak intensity vary with the radius of the orbit and the particle energy (G. Gahwiller et al, *Reviews of Scientific Instruments*, 41 (1970) 1275). Such accelerators can serve as an intense source of radiation in the X-ray region of the spectrum, for example, an electron synchrotron with a 3 meter radius and particle energy of 1 Gev emits X-rays whose wavelength at peak intensity is approximately 15A. The accelerator requires a magnetic field of $11.6 \times 10^3$ oersteds. When such an accelerator operates with a current of $10^{-1}$ amperes, the accelerator emits X-rays with an intensity of 300 watts/A-milliradians. The use of a source of this intensity implies exposure times more than 1000 times less than the times required using X-ray tubes.

FIG. 2 illustrates, schematically, a particle beam 21 confined within the evacuated portion 22 of an accelerator with a beam of radiation 23 being emitted tangentially through a window 24 in the evacuated chamber 22. For convenience of drawing the transparent window material is not shown. The radiation is emitted uniformly around the orbit and collimated, typically to within less than 1 milliradian of the plane of the orbit. This high degree of collimation reduces the problem of runout distortion by eliminating the runout in one direction and reduces the intensity fall off problem since the intensity varies as the reciprocal of the distance from the beam orbit as opposed to varying as reciprocal of the square of the distance from the point source of an X-ray tube.

BRAGG REFLECTION FILTERING

The absence from synchrotron radiation of sharp peaks of characteristic radiation makes the use of some form of filtering highly desirable in order to improve the contrast of the exposed resist layer. The high degree of collimation which is characteristic of synchrotron radiation permits the use of Bragg reflection from an oriented crystal as an efficient and highly selective filtering technique. As shown in FIG. 2 the X-ray beam 23 is incident on a crystalline body 25 at a selected angle 26 and reflected through a shadow mask 27 against the device precursor being exposed 28. The angle 26 is selected in accordance with well known principles of Bragg scattering in consideration of the interplanar spacing of the crystalline material 25 and the desired wavelength of the reflected beam 29.

Bragg reflection is highly selective as to angle and wavelength. It provides efficient reflection of a narrow wavelength band of radiation. For example in the 10A wavelength region the wavelength of Bragg reflection has a half width of the order of $10^{-3}$ A. This high selectivity, while excellent from a contrast point of view, results in generally inordinately high loss of intensity and correspondingly long exposure times. This problem can be alleviated and an effective compromise between high intensity and high selectivity can be achieved, through the use of an inhomogeneously reflecting crystalline body in place of a single crystal as the Bragg reflector.

Inhomogeneously reflecting crystalline bodies useful in the invention are bodies in which the condition for Bragg reflection vary to a small controlled degree from place to place through the thickness of the body. This may take the form of a body of inhomogeneous composition (producing a variation of lattice parameter) or a mosaic crystal. A mosaic crystal is a crystalline body composed of a plurality of crystallites whose orientations are all quite close to the average orientation of the mosaic crystal but vary in a random way through the thickness of the crystal with an angular spread of from of the order of a tenth of a degree to several degrees. Mosaic crystals are available, each of which have a constant and uniform spread at many valves within this range. The most widely commercially available crystals are of graphite. The angular spread is defined as the angular width of a reflected beam of monochromatic radiation at ½ peak intensity. When used to reflect the broad intensity spectrum of synchrotron radiation, a mosaic crystal will reflect over a much wider portion of the incident energy spectrum. For example a mosaic crystal whose angular spread is ½ degree will reflect X-rays over a band of approximately $10^{-1}$ A in the 10A wavelength region. This represents an improvement of approximately 100 times over the intensity available through Bragg reflection from a single crystal. Mosaic crystals with an angular spread from $10^{-4}$ radians to $10^{-1}$ radians are useful in the inventive process, depending upon the balance one desired to achieve between the desire to limit bandwidth and the desire to provide high intensity. The angular spread range which is preferred for most uses is from $10^{-3}$ radians to $10^{-2}$ radians. As illustrated in FIG. 3 the highly collimated incident beam 31 is inciident on a mosaic crystal 32 at the preselected angle $\theta$ and the reflected beam 33 has an angular spread $\Delta\theta$ which corresponds to the angular spread of the crystallites of the mosaic crystal. This still represents a degree of collimation which is too small to cause appreciable runout in that direction. The beam 33 is incident, through a shadow mask 34, on the device precursor 35 being exposed. If the device precursor is placed at a distance (as illustrated in FIG. 3) such that the beam strikes only a portion of its surface the device precursor must be translated in a direction by the arrows 36 to provide exposure of the entire wafer 35 to the beam 33.

Although the use of a mosaic crystal 32 does produce some angular spread of the beam 33 the principle effect is to produce the reflection of a wider band of wavelengths thus greatly increasing the beam intensity. In order to provide a desirably high degree of contrast in the exposed resist with a minimum absorber layer thickness, it is desirable to limit the wavelength spread of the reflected beam to less than ½A. For the most demanding and sensitive uses, a wavelength limitation to a band of less than 1/10th A is desirable. Using a graphite mosaic crystal in the 10A wavelength region at a 22° incidence angle, mosaic crystals with angular spreads of 50 milliradians and 10 milliradians respectively, will accomplish the above wavelength limitations.

Although the beam of synchrotron radiation is highly collimated in the plane of the particle orbit the beam is spread out in angle around the orbit. One must make the window 24 wide enough to get the desired beam intensity and spread and beam out over the device precursor being exposed. Typical beam divergences are of the order of 5°. As in the case of the X-ray tube, runout problems produced by this beam divergence can be reduced by operation further from the orbit. The use of synchrotron radiation offers an advantage in this respect, in that its intensity only varies as the reciprocal of the distance as opposed to the reciprocal of the square of the distance. It is possible, however, to operate closer and at least partially compensate for the beam divergence by shaping the mosaic crystals 41, as indicated in FIG. 4, such that the incident divergent beam 42 is reflected as a more parallel beam 43. The shaping must be done so as to preserve the average orientation of the mosaic crystal relative to each part of the surface of the crystal, either by suitable processing during the production of the crystal or by producing a shape change by elastic deformation (bending). The grinding of an already formed mosaic crystal to the desired concave shape will be much less effective in producing the desired result.

If it is necessary or advisable to minimize out of band X-rays, incident on the device precursor due to second order Bragg reflection, a reflector material may be selected, in which second order Bragg reflection is suppressed due to the structure factor of the unit cell. The first out of band reflections observed will then be third order reflections at much higher energy. Reflection efficiency in the third order is generally much lower and the intensity of such high energy X-rays is much reduced for most contemplated situations.

An exemplary electron storage ring with a three meter radius operating at 1.18 Gev with one ampere current emits X-rays with peak intensity at approximately 10A and power level approximately 1000 watts per radian-A. Such a machine will irradiate a 10 centimeter wafer, one meter from the ring, at 4A with a dose of 50 millijoules per square centimeter in one second if the radiation is reflected from a graphite mosaic crystal with an angular spread of 5 milliradians (~¼ degree) at a 22.5° incidence angle.

What is claimed is:

1. Method of photolithographic processing comprising directing a beam of electromagnetic radiation in the wavelength range 1 A to 50 A through a shadow mask, against a device precursor consisting of a substrate and an image forming layer, sensitive to the radiation, producing a change in the cohesiveness of the irradiated portion of the layer CHARACTERIZED IN THAT the radiation is directed against the device precursor by means of Bragg reflection from an inhomogeneously reflecting crystalline body, which inhomogeneously reflecting crystalline body consists of a multitude of crystallites whose angular spread of crystalline orientation is from $10^{-4}$ radians to $10^{-1}$ radians of angle, which radiation is synchrotron radiation and which crystalline body is shaped so as to compensate for the angular deviation of the synchrotron radiation and produce a more nearly parallel beam.

2. A method of claim 1 in which the crystalline body is shaped by elastic deformation.

3. Method of photolithographic processing comprising directing a beam of electromagnetic radiation in the wavelength range 1 A to 50 A through a shadow mask, against a device precursor consisting of a substrate and an image forming layer, sensitive to the radiation, producing a change in the cohesiveness of the irradiated portion of the layer characterized in that the radiation is directed against the device precursor by means of Bragg reflection from an inhomogeneously reflecting crystalline body, which radiation is synchroton radiation, and which inhomogeneously reflecting crystalline body consists of a multitude of crystallites whose angular spread of the crystalline orientation is from $10^{-3}$ radians to $10^{-2}$ radians of angle.

* * * * *